(12) United States Patent
Kim

(10) Patent No.: US 11,225,190 B2
(45) Date of Patent: Jan. 18, 2022

(54) VEHICLE AND METHOD OF CONTROLLING THE SAME

(71) Applicants: HYUNDAI MOTOR COMPANY, Seoul (KR); KIA MOTORS CORPORATION, Seoul (KR)

(72) Inventor: Sung Eun Kim, Seoul (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 314 days.

(21) Appl. No.: 16/405,735

(22) Filed: May 7, 2019

(65) Prior Publication Data
US 2020/0130568 A1 Apr. 30, 2020

(30) Foreign Application Priority Data
Oct. 27, 2018 (KR) .......................... 10-2018-0129408

(51) Int. Cl.
*B60Q 1/42* (2006.01)
*H03K 17/97* (2006.01)
*G05D 1/02* (2020.01)

(52) U.S. Cl.
CPC .............. *B60Q 1/425* (2013.01); *H03K 17/97* (2013.01); *G05D 1/021* (2013.01); *H03K 2017/9713* (2013.01)

(58) Field of Classification Search
None
See application file for complete search history.

(56) References Cited

U.S. PATENT DOCUMENTS 9,327,635 B2 * 5/2016 Scheck ............... B60Q 1/34
2016/0185279 A1 * 6/2016 Zagorski ............ B60Q 1/346
701/36

* cited by examiner

*Primary Examiner* — Daniel C Puentes
(74) *Attorney, Agent, or Firm* — Lempia Summerfield Katz LLC

(57) ABSTRACT

A vehicle includes a lever; a magnetic sensor configured to detect an angle of movement of the lever; an inputter configured to receive setting information regarding a lane change and a drive mode from a user; and a controller configured to determine whether to lock the lever based on at least one of the detected angle, the setting information, and the drive mode, and unlock the lever based on the drive mode and the lane change.

19 Claims, 7 Drawing Sheets

FIG. 7

|  |  | OPERATING ANGLE ||
|  |  | GENERAL | ADJUSTED |
| --- | --- | --- | --- |
| RUNNING SPEED OF VEHICLE | LOW SPEED (LESS THAN 30KPH) | 7° | 5.5° |
| | MEDIUM SPEED (31KPH-70KPH) | 6° | 4.5° |
| | HIGH SPEED (MORE THAN 71KPH) | 5° | 3.5° |
| USER INPUT || 6° | 4.5° |

VEHICLE AND METHOD OF CONTROLLING THE SAME

CROSS-REFERENCE TO RELATED APPLICATION

This application is based on and claims priority under 35 U.S.C. § 119 to Korean Patent Application No. 10-2018-0129408, filed on Oct. 27, 2018 in the Korean Intellectual Property Office, the disclosure of which is incorporated herein by reference.

BACKGROUND

1. Field

The disclosed embodiment relates to a turn signal switch for receiving an input needed for controlling a turn signal and a travel.

2. Description of the Related Art

Autonomous navigation refers to a technology that a vehicle navigates to a destination by identifying a situation by itself using various sensors of the vehicle, such as a global positioning system (GPS), and the like without a driver manipulating a steering wheel, an accelerator pedal, a brake, and the like.

The autonomous navigation technology includes a lane change, on which not only technical research is conducted but also related legislation is being established. In detail, the autonomous navigation-related legislation currently being debated includes a regulation that a lane change is set to operate only by continuously applying a user's input regarding the lane change until the lane change is completed, in addition to simply applying the user's input.

SUMMARY

One aspect of the invention provides a vehicle capable of satisfying the stability and the convenience of user by adjusting a setting of a turn signal switch that is adjustable to suit a taste of a user and a status of a vehicle currently running while meeting related legislation required in autonomous navigation, and a method of controlling the same.

Additional aspects of the invention will be set forth in part in the description which follows and, in part, will be obvious from the description, or may be learned by practice of the invention.

Therefore, it is an aspect of the present invention to provide a vehicle including: a lever; a magnetic sensor configured to detect an angle of movement of the lever; an inputter configured to receive setting information regarding a lane change and a drive mode from a user; and a controller configured to determine whether to lock the lever on the basis of at least one of the detected angle, the setting information, and the drive mode, and unlock the lever on the basis of the drive mode and the lane change.

The setting information may include first setting information for moving the lever to a reference position after a predetermined time and second setting information for holding the lever at the detected angle of the lever.

The drive mode may include a first drive mode for changing lanes on the basis of a nearby vehicle sensed by the vehicle and a second drive mode for changing lanes on the basis of a steering angle of a steering wheel manipulated by the user.

In response to the first setting information and the first drive mode, the controller may determine whether the lane change is performed, and subsequently cause the lever to be unlocked.

In response to the first setting information and the second drive mode, the controller may generate a signal regarding the lane change, and subsequently cause the lever to move to the reference position.

In response to the second setting information and the first drive mode, the controller may determine whether the lane change is performed, and subsequently cause the lever to be unlocked.

In response to the second setting information and the second drive mode, the controller may cause the lever to be unlocked on the basis of the steering angle of the steering wheel and a vehicle speed of the vehicle.

The vehicle may further include a solenoid configured to hold the lever, wherein the controller may control the solenoid to lock the lever.

The inputter may receive an input regarding an operating angle, and the controller may compare the angle of movement of the lever with the operating angle.

The controller may adjust the operating angle on the basis of a speed at which the vehicle travels.

It is another aspect of the present invention to provide a method of controlling a vehicle, the method including: receiving setting information regarding a lane change and a drive mode from a user; detecting, by a user, an angle of movement of the lever; determining whether to lock the lever on the basis of at least one of the detected angle, the setting information, and the drive mode; and unlocking the lever on the basis of the drive mode and the lane change.

The method may further include performing a full turn when the angle of movement of the lever is greater than or equal to a predetermined angle.

The setting information may include first setting information for moving the lever to a reference position after a predetermined time and second setting information for holding the lever at the detected angle of the lever, and the drive mode may include a first drive mode for changing lanes on the basis of a nearby vehicle sensed by the vehicle and a second drive mode for changing lanes on the basis of a steering angle of a steering wheel manipulated by the user.

The unlocking may include, in response to the first setting information and the first drive mode, determining whether the lane change is performed, and subsequently unlocking the lever.

The unlocking may include, in response to the first setting information and the second drive mode, generating a signal regarding the lane change, and subsequently moving the lever to the reference position.

The unlocking may include, in response to the second setting information and the first drive mode, determining whether the lane change is performed, and subsequently unlocking the lever.

The unlocking may include, in response to the second setting information and the second drive mode, unlocking the lever on the basis of the steering angle of the steering wheel and a vehicle speed of the vehicle.

The receiving may include receiving an input regarding an operating angle, wherein the determining of whether to lock the lever may include comparing the angle of movement of the lever with the operating angle.

The method may further include adjusting the operating angle on the basis of a speed at which the vehicle travels.

The receiving may include, after ignition of the vehicle is turned on, receiving the setting information regarding the lane change and the drive mode from the user.

BRIEF DESCRIPTION OF THE DRAWINGS

These and/or other aspects of the invention will become apparent and more readily appreciated from the following description of the embodiments, taken in conjunction with the accompanying drawings of which:

FIG. 7 is a table for describing an embodiment for changing an operating angle.

DETAILED DESCRIPTION

Figure 1:
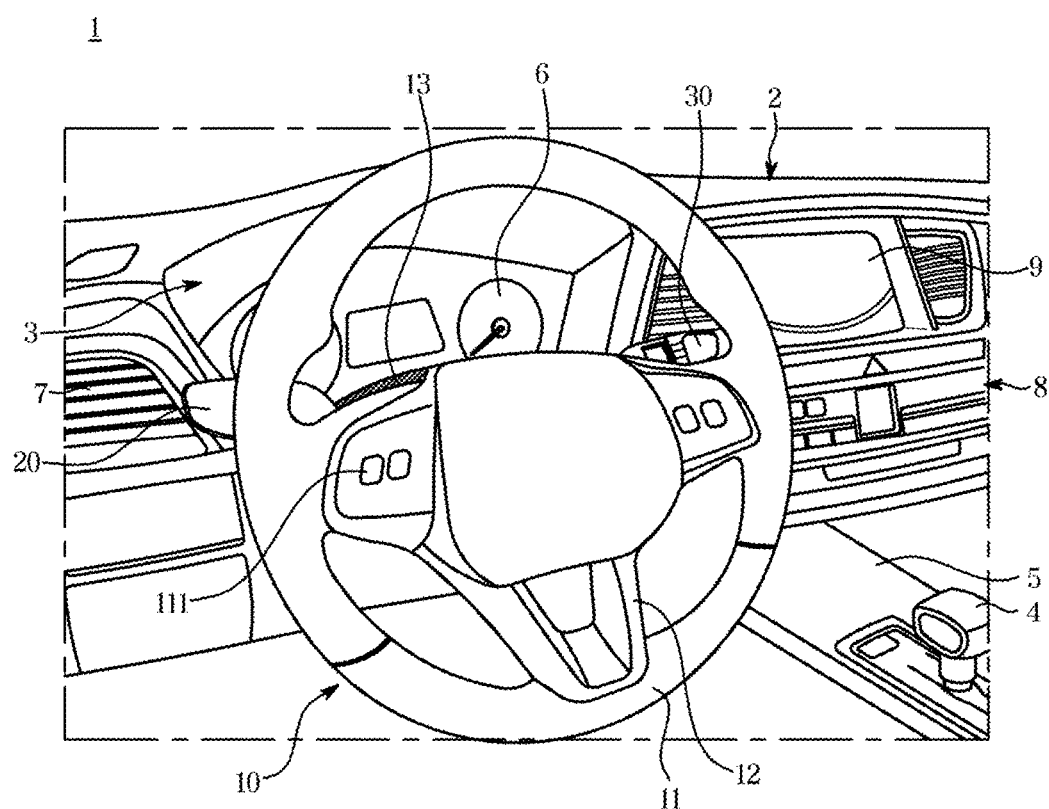
FIG. 1 is a diagram illustrating an interior of a vehicle including a turn signal switch according to an embodiment.

Like numerals refer to like elements throughout the specification. Not all elements of embodiments of the present disclosure will be described, and description of what are commonly known in the art or what overlap each other in the embodiments will be omitted. The terms as used throughout the specification, such as "~ part", "~ module", "~ member", "~ block", etc., may be implemented in software and/or hardware, and a plurality of "~ parts", "~ modules", "~ members", or "~ blocks" may be implemented in a single element, or a single "~ part", "~ module", "~ member", or "~ block" may include a plurality of elements.

It will be further understood that the term "connect" or its derivatives refer both to direct and indirect connection, and the indirect connection includes a connection over a wireless communication network.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof, unless the context clearly indicates otherwise.

Further, it will be further understood when a signal or data is transferred, sent or transmitted from "an element" to "another element", it does not exclude another element between the element and the other element passed by the signal or data therethrough, unless the context clearly indicates otherwise.

Although the terms "first," "second," "A," "B," etc. may be used to describe various components, the terms do not limit the corresponding components, but are used only for the purpose of distinguishing one component from another component.

As used herein, the singular forms "a," "an" and "the" are intended to include the plural forms as well, unless the context clearly indicates otherwise.

Reference numerals used for method steps are just used for convenience of explanation, but not to limit an order of the steps. Thus, unless the context clearly dictates otherwise, the written order may be practiced otherwise.

Hereinafter, the operating principles and embodiments of the present disclosure will be described with reference to the accompanying drawings.

FIG. 1 is a diagram illustrating an interior of a vehicle including a turn signal switch according to an embodiment.

Referring to FIG. 1, the interior of a vehicle 1 includes a dashboard 2, a center fascia 3 extending from the dashboard 2, a gear rod 4 disposed at a lower end of the center fascia 3, and a console box 5 accommodating the gear rod 4.

The dashboard 2 partitions a space including components needed for a travel, such as an engine, from an interior space in which a user sits, and is provided with an instrument panel 6, a vent 7, an audio-video-navigation (AVN) device 8, and a steering wheel 10.

The instrument panel 6 may display the running speed, the engine rpm, the amount of fuel remaining, the distance to empty, and the like. For example, the instrument panel 6 displays the vehicle speed collected from a speed sensor (120 in FIG. 3) that senses the rotational speed of vehicle wheels. The instrument panel 6 is generally installed on a portion of the dash board 2 behind the steering wheel 10.

The vent 7 is a component to discharge air at a predetermined temperature to the inside of the vehicle 1 according to the operation of an air conditioner. The vent 7 may be installed in various positions of the dashboard 2. The vent 7 may be installed on both sides of a display 9 included in the AVN device 8 as shown in FIG. 1.

The AVN device 8 refers to an electronic control unit that collectively manages a speaker for outputting a radio program, a sound effect, and various other types of sounds to the user, a display for outputting various images such as moving images and still images, and a navigation system for navigating a destination. Although the AVN device 8 is illustrated as having only the display 9 for outputting an image in FIG. 1, the AVN device 8 may output functions executed through various hardware devices included in the vehicle 1.

The steering wheel 10 may be installed on a portion of the dashboard 2 adjacent to a driver's seat.

The steering wheel 10 may include a rim 11 gripped by a driver and a spoke 12 connecting the rim 11 to a hub 13 of a steering device positioned on a rotary shaft for steering. The driver may allow the vehicle 1 to make a turn by rotating the rim 11 or the spoke 12 to change the heading direction of the vehicle wheels.

The spoke 12 may be provided with various input buttons 111 for receiving commands to be input to the instrument panel 6 and a control unit included in the vehicle 1.

The hub 13 may connect the steering wheel 10 to the dashboard 2, and include a turn signal switch 20 and a wiper switch 30. In embodiments, the turn signal switch 20 receives an input command for controlling turn on/off of a turn signal light provided at an outer side of the vehicle 1. The turn signal switch 20 is a hardware device of an inputter (110 in FIG. 3) for receiving an input command regarding autonomous driving for a lane change or a full turn. Details of the turn signal switch 20 will be described below in detail with reference to FIG. 2.

Meanwhile, a lane change refers to changing a lane on which the vehicle 1 is traveling to a next lane during a travel, and a full turn refers to travelling with the front of the vehicle 1 rotated by 90 degrees or more, or changing the heading direction by 180 degrees.

Figure 2:
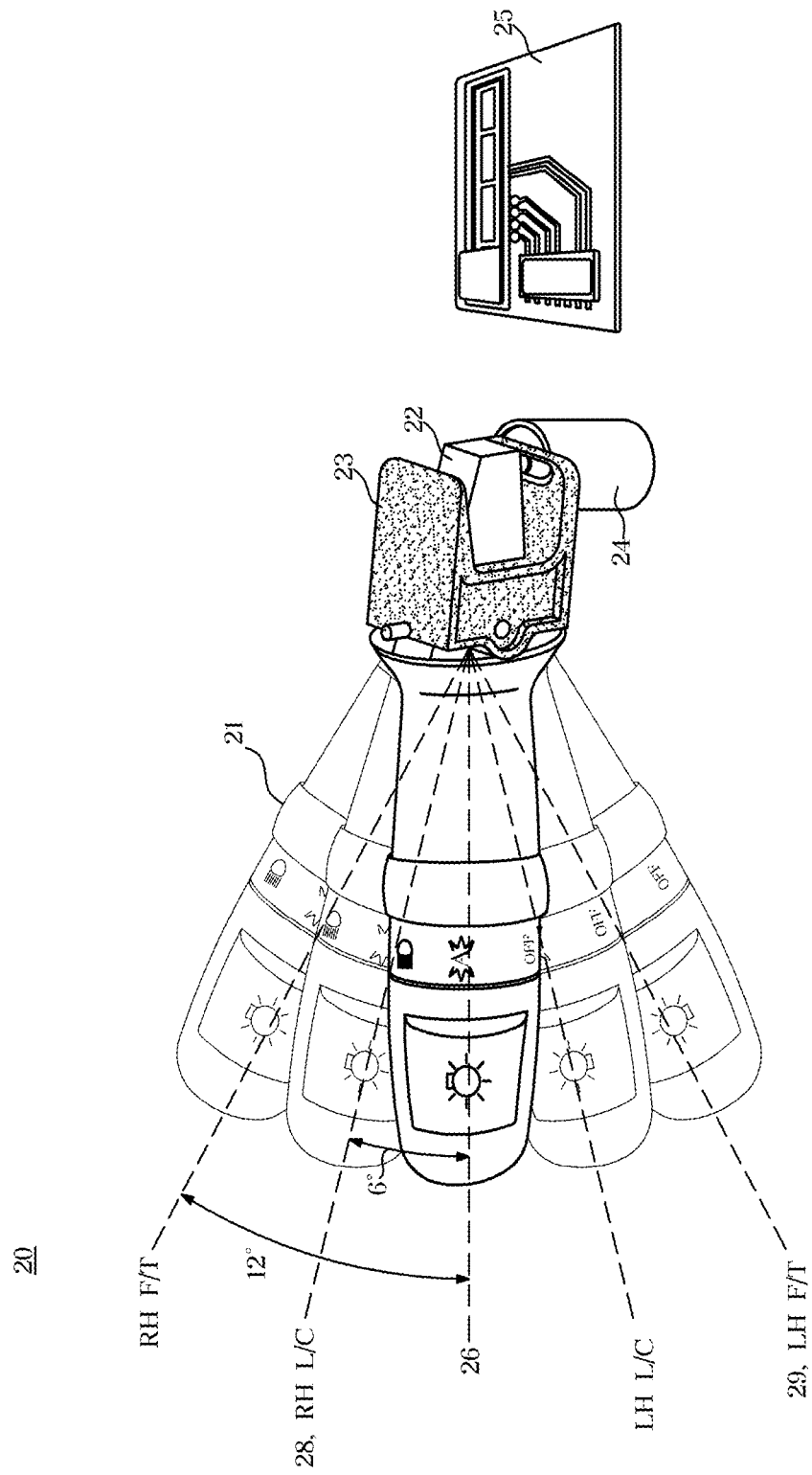
FIG. 2 is a diagram for describing a configuration and an operation of a turn signal switch according to an embodiment.

FIG. 2 is a diagram for describing a configuration and operation of the turn signal switch according to the embodiment.

Referring to FIG. 2, the turn signal switch 20 includes a lever 21, a connecting portion 23 for holding the lever 21 which is moved in connection with a lever shaft 22, a solenoid 23 for operating the connecting portion 23, and a magnetic sensor 25 for detecting an angle of movement of the lever 24.

In detail, the lever 21 may be moved up and down by a user's grip. The lever 21 is integrally formed with the lever shaft 22, and the lever 21 vertically moved is held by the connecting portion 23 that connects the lever 21 to the lever shaft 22. In embodiments, the lever 21 may be operated by the force of the user, and the connecting portion 23 supports the lever 21 shifted in position.

The solenoid 24 is provided with a conductive wire densely wound inside therein, and is used as an electromagnet by applying a current through the conductive wire to generate a magnetic field. The turn signal switch 20 applies a magnetic field of the solenoid 24 serving as an electromagnet to the connecting portion 23 to thereby hold the lever 21 shifted in position.

The magnetic sensor 25 detects the angle of movement of the lever 21. The magnetic sensor 25 may include a Hall sensor for sensing the position of the moved lever 21 using the Hall effect, a magnetic resistance (MR) sensor, and an MR sensor using an integrated circuit (IC). Although the magnetic sensor 25 is illustrated as an MR sensor in FIG. 2, the magnetic sensor 25 according to the disclosure is not limited thereto.

Figure 3:
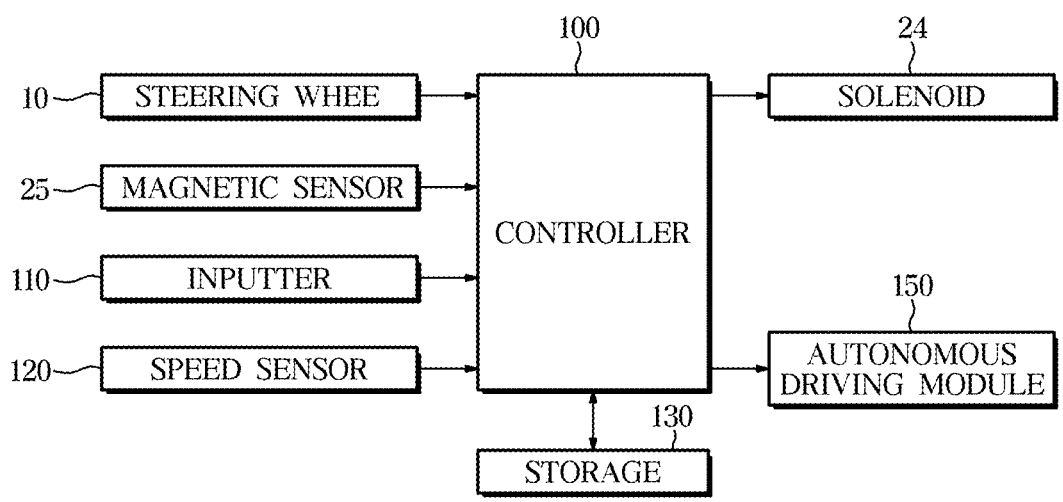
FIG. 3 is a control block diagram of a vehicle according to an embodiment.

The angle of movement of the lever 21 detected by the magnetic sensor 25 is converted into an electrical signal and then is transmitted to a controller (100 in FIG. 3). Based on the angle detected by the magnetic sensor 25, the controller 100 determines whether an input is for a lane change or a full turn.

The turn signal switch 20 according to the embodiment determines whether an input is for a lane change or a full turn depending on an operating angle as shown in FIG. 2.

In detail, when the lever 21 is vertically moved by 6 degrees from a reference position 26, the controller 100 may determine the input to be an input regarding a lane change. In addition, when the lever 21 is moved by 12 degrees from the reference position 26, the controller 100 determines the input to be an input regarding a full turn.

As an example, when the driver moves the lever 21 clockwise by 6 degrees from the reference position 26 (28, Right Hand Lane change, RF L/C) while the vehicle 1 is traveling, the controller 100 may perform autonomous driving to switch from a lane currently being travelled on to the right lane. In addition, the controller 100 may turn on a turn signal light while changing the lanes.

As another example, when the driver moves the lever 21 counterclockwise (29, Left Hand Full Turn, RF F/T) by 12 degrees from the reference position 26 while the vehicle 1 is travelling, the controller 100 may control the vehicle 1 to make a left turn in consideration of the condition of the road currently being travelled on.

Meanwhile, when the lever 21 is moved, the vehicle 1 operates the solenoid 24 to hold the lever 21 for a preset time. After the preset time, the turn signal switch 20 may return the lever 21 to the reference position 26 (self-return type) or hold the lever 21 in the moved position until an addition input is received (lock type). Such a control method may be determined based on setting information input by a user. In the following description, the self-return type is referred to as first setting information, and the lock type is referred to as second setting information.

FIG. 3 is a control block diagram of a vehicle according to an embodiment.

Referring to FIG. 3, the vehicle 1 includes the steering wheel 10 for receiving a user's input command to control a steering angle, the magnetic sensor 25 included in the turn signal switch 20, the inputter 110 for receiving input information from the user, a speed sensor 120 for detecting the running speed of the vehicle 1, a storage 130 for storing various types of data, the solenoid 24 included in the turn signal switch 20, and the controller 100 for controlling the above described components.

The vehicle 1 may further include an autonomous driving module 150 that performs an autonomous driving based on a result of determination of the controller 100. In the following description of the steering wheel 10, the solenoid 24, and the magnetic sensor 25, the configuration and structure identical to those described in FIGS. 1 and 2 will be omitted.

The inputter 110 receives various input commands regarding setting information and a drive mode from a user.

In detail, the setting information represents a command regarding the operation of the turn signal switch 20, such as the self-return type operation (first setting information) and the lock type operation (second setting information) as described above. Upon receiving the first setting information, the controller 100 moves the lever 21 to the reference position 26 again after a preset time, when the user moves the lever 21. Upon receiving the second setting information, the controller 100 moves the lever 21 to the reference position 26 when various conditions which will be described with reference to the other drawings are satisfied.

The drive mode may be divided into an autonomous drive mode (hereinafter referred to as a first drive mode) in which the vehicle 1 autonomously travels without detailed manipulation of the user based on information collected from the sensor, and a manual drive mode in which the vehicle 1 travels according to a user's input (hereinafter, referred to as a second drive mode).

The first drive mode includes performing various automation features, such as a smart cruise drive in which the vehicle 1 travels at a preset vehicle speed while maintaining an interval with another vehicle traveling ahead without a user's manipulation on an accelerator, a turn signal driving in which the vehicle 1 changes lanes while sensing another vehicle travelling on a lateral side lane, and the like.

Meanwhile, the autonomous driving includes specific driving levels defined by the Society of Automotive Engineers (SAE). In detail, autonomous driving may be divided into level 1 in which assistant is provided to a driver, level 2 in which two or more automation functions are simultaneously operated and thus a driver's constant supervision is required, level 3 in which an autonomous driving is performed based on artificial intelligence but user's intervention is required in a specific situation, level 4 in which driver's monitoring is not required in various driving environments including city driving, and level 5 in which driver's intervention does not exist in all environments. Currently, research on autonomous driving is directed to the above described levels 2 and 3.

In the following description, autonomous driving refers to performing the automation function included in level 2 or 3, and the setting information and the drive mode represent input information regarding the automation function inputted by the user in level 2 or 3.

The inputter 110 receives an input command regarding the above described setting information and drive mode through a hardware configuration provided on the steering wheel 10 and the turn signal switch 20. However, the inputter 110 may be provided as a hardware device, such as various buttons or switches, a pedal, a keyboard, a mouse, a track ball, various levers, a handle, a stick, and the like, and may be provided in the vehicle 1.

In addition, the inputter 110 may include a graphical user interface (GUI) for a user input, such as a touch pad or the like, for example, a software device. The touch pad is implemented as a touch screen panel (TSP), and may form a mutual layer structure together with a display. When is implemented as a TSP forming a mutual layer structure with the display, the inputter 110 may serve as a display.

The speed sensor 120 is provided to measure the running speed of the vehicle 1 (hereinafter, referred to as a vehicle speed). The speed sensor 120 may be implemented using various devices capable of measuring the vehicle speed. For example, the speed sensor 120 may be implemented using a device for measuring revolution per minute (RPM) of the engine or the number of revolutions of the vehicle wheels, for example, an encoder.

According to some embodiments, the vehicle speed may be measured by the speed sensor 120, but may also be detected using collected position data. For example, the controller 100 may record the position of the vehicle 1 in navigation information at each preset time, and may calculate the vehicle speed using consecutively recorded positions and an elapsed time. In addition, the vehicle speed may be obtained using a gyro sensor and a yaw rate sensor.

Although only the magnetic sensor 25 and the speed sensor 120 are illustrated in FIG. 3, the vehicle 1 may further include various sensors needed to perform the control method according to the disclosure.

The storage 130 stores data regarding setting information and drive mode received by the inputter 110 and stores the current vehicle speed detected by the speed sensor 120. The stored data is provided to be used by the controller 100 in a determination process, which will be described below.

In addition to storing temporarily used data, the storage 130 stores data regarding a lane change cancellation condition and an operating angle which will be described below with reference to FIGS. 6 and 7. The data is stored in the storage 130 semi-permanently regardless of whether ignition of the vehicle 1 is turned on or off.

The storage 130 may be implemented as at least one of a nonvolatile memory device, such as a cache, a read only memory (ROM), a programmable ROM (PROM), an erasable programmable ROM (EPROM), an electrically erasable programmable ROM (EEPROM), and a flash memory; a volatile memory device, such as a random access memory (RAM); or other storage media, such as a hard disk drive (HDD), a CD-ROM, and the like. However, the storage 180 according to the present disclosure is not limited thereto. The storage may be implemented a memory implemented as a chip separated from the processor described above with regard to the controller, or may be implemented as a single chip integrated with the processor.

The autonomous driving module 150 includes an electronic control unit for performing autonomous driving, and controls various hardware configurations in the vehicle 1 under the control of the controller 100.

In detail, the autonomous driving module 150 may include an Advanced Driver Assistance System (ADAS) and may perform various autonomous driving features, such as adaptive cruise control, blind zone monitoring, lane change, night vision, lane maintenance assistant modules, collision alert and avoidance, and the like.

The autonomous driving module 150 may change lanes based on an input regarding a lane change input by the user. At this time, the autonomous driving module 150 receives position information and speed information of other vehicles traveling ahead and in a lane in which the vehicle 1 is planning to transition. The autonomous driving module 150 determines whether to perform a lane change, based on the received information, and changes lanes while changing a steering angle and a vehicle speed of the vehicle wheels that are determined. In addition, the autonomous driving module 150 may inform the user that the lane change is being performed by operating the steering wheel 10.

Although the autonomous driving module 150 is illustrated as a control unit independent of the controller 100, but is not limited thereto. In embodiments, when the autonomous driving module 150 is implemented as a processor for executing an algorithm that controls a hardware configuration for autonomous driving or a program that represents the algorithm, the autonomous driving module 150 may be implemented as a single chip integrated with the controller 100.

The controller 100 controls the overall operation on the above-described configuration and the vehicle 1.

After the inputter 110 receives setting information and a drive mode regarding a lane change from the user, the controller 100 determines whether to lock the lever 21 based on at least one of the detected angle, the setting information, and the drive mode. In addition, the controller 10 causes the lever 21 to be unlocked based on the drive mode and completion of the lane change.

As an example, the user may input the first setting information (self-return type) and the first drive mode (autonomous driving mode). After storing the input data, the controller 100 monitors an input regarding a lane change that is input by the user through the lever 21 during travel of the vehicle 1. When the lever 21 is moved upward by 6 degrees from the reference position 26, the controller 100 operates the solenoid 24 to hold the lever 21 at the moved position. Then, the controller 100 controls the autonomous driving module 150. The autonomous driving module 150 allows the vehicle 1 to move into the right lane of the lane currently being travelled on by the vehicle 1. The controller 100 causes the lever 21 to be unlocked upon receiving a signal indicating that the lane change is completed from the autonomous driving module 150.

As another example, the user may input the first setting information (self-return type) and the second drive mode (manual drive mode). The controller 100 monitors an input regarding a lane change that is input by the user through the lever 21 during travel of the vehicle 1. When the lever 21 is moved upward by degrees from the reference position 26, the controller 100 allows the turn signal light to be turned on, and the lever 21 returns to the reference position 26 without determination on the lane change.

Although the above described embodiment is made in relation that the first drive mode is set through the user's input, the present disclosure is not limited thereto. For example, when it is determined that the current vehicle 1 travels on a highway and the vehicle speed is equal to or higher than a predetermined speed based on navigation information, the controller 100 may change from the second drive mode to the first drive mode. In this case, the controller 100 may output an interface for informing a driver of a status of the mode having been changed.

The control method performed by the controller 100 will be described below in detail with reference to FIGS. 4 and 5.

Meanwhile, the controller 100 may include a memory for storing data regarding an algorithm for controlling the operations of the components of the vehicle 1 or a program that represents the algorithm, and a processor that performs the above described operations using the data stored in the memory. In embodiments, the memory and the processor may be implemented as separate chips. Alternatively, the memory and the processor may be implemented as a single chip.

The components of the vehicle 1 shown in FIG. 3 refer to a software component and/or a hardware component, such as a field programmable gate array (FPGA) and an application specific integrated circuit (ASIC), and at least one component may be added or omitted to correspond to the performance of the components. The mutual positions of the components may be changed to correspond to the performance or structure of the system.

The vehicle 1 may further include other components not shown in FIG. 3, and may include all components capable of performing the control method described below.

Figure 4:
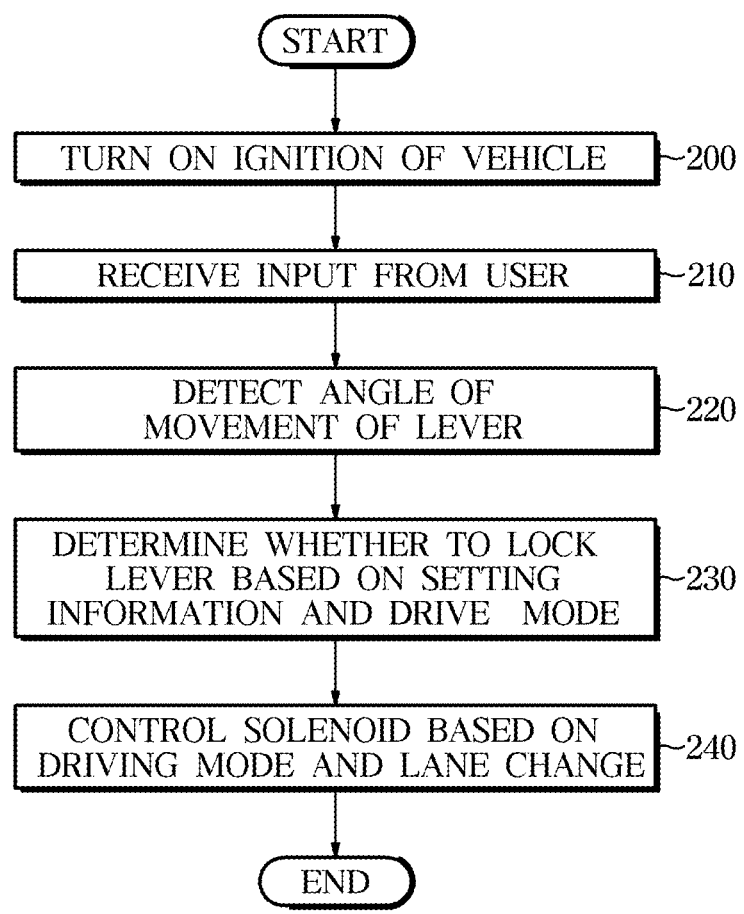
FIG. 4 is a flowchart showing a method of controlling a vehicle according to an embodiment.

FIG. 4 is a flowchart showing a method of controlling a vehicle according to an embodiment.

Referring to FIG. 4, ignition of the vehicle 1 is turned on by the user (200).

After the ignition-on, the vehicle 1 receives an input from a user (210).

In detail, the vehicle 1 receives setting information and a drive mode from the user. The vehicle 1 determines whether to lock or unlock the lever 21 based on the input setting information and the input drive mode until the ignition is turned off or another setting information is received.

In addition to the setting information and the drive mode, the inputter 110 may further receive an operating angle and an operation angle related input that is changed in association with the vehicle speed.

Here, the operating angle refers to the minimum angle at which a lane change and a full turn are recognized through the lever 21. For example, when the operating angle represent a lane change at a predetermined vehicle speed (31 KPH to 70 KPH) is 6 degrees, the vehicle 1 determines that an input instructing a lane change is received only when the lever 21 is moved by 6 degrees during traveling at a vehicle speed of 40 KPH.

The vehicle 1 detects the angle of movement of the lever 21 during traveling (220).

According to an example, the lever 21 may be moved upward and downward from the reference position 26 by the user's input. However, the present disclosure is not limited thereto, and the lever 21 may be moved from the reference position 26 toward the driver's seat or the dashboard 2.

The vehicle 1 determines whether to lock the lever 21 based on the setting information and the drive mode (230).

As an example, when the lever 21 is moved by 6 degrees from the reference position 26, the vehicle 1 may determine that an input regarding a lane change has been received. In response to the first setting information and the first drive mode being input from the user, the vehicle 1 may allow the lever 21 to be held at the moved position. However, in response to the first setting information and the second drive mode being input, the vehicle 1 may allow the lever 21 to be moved to the reference position 26 after a preset time without locking the lever 21.

Meanwhile, the moving of the lever 1 to the reference position by the vehicle 1 may be performed by controlling the solenoid 24. In detail, when it is determined to lock the lever 21, the vehicle 1 drives the solenoid 21 to hold the lever 21. In a case that the solenoid 21 is not driven, the lever 21 may be automatically moved to the reference position 26 by a hardware device of the connecting portion 23 without a control signal.

After the locking of the lever 21, the vehicle 1 may unlock the lever 21 based on the drive mode and the lane change (240).

As an example, the locking of the lever 21 may be performed in response to the first setting information and the first drive mode being received, the first setting information and the second drive mode being received, the second setting information and the first drive mode being received, and the second setting information and the second drive mode being received.

The vehicle 1 may change lanes without a user's manipulation of the steering wheel 10 based on the control method performed by the autonomous driving module 150 in case of the first setting information and the first drive mode being received and in case of the second setting information and the first drive mode. When the autonomous lane change is completed, the vehicle 1 unlocks the lever 21.

In a case of the second setting information and the second drive mode being input, the vehicle 1 determines a lane change based on a user's manipulation of the steering wheel 10. In detail, the vehicle 1 determines whether to change lanes from the relation between the vehicle speed based on navigation information and the like and the angle sensor variation. Details thereof will be described below with reference to FIG. 6.

Figure 5:
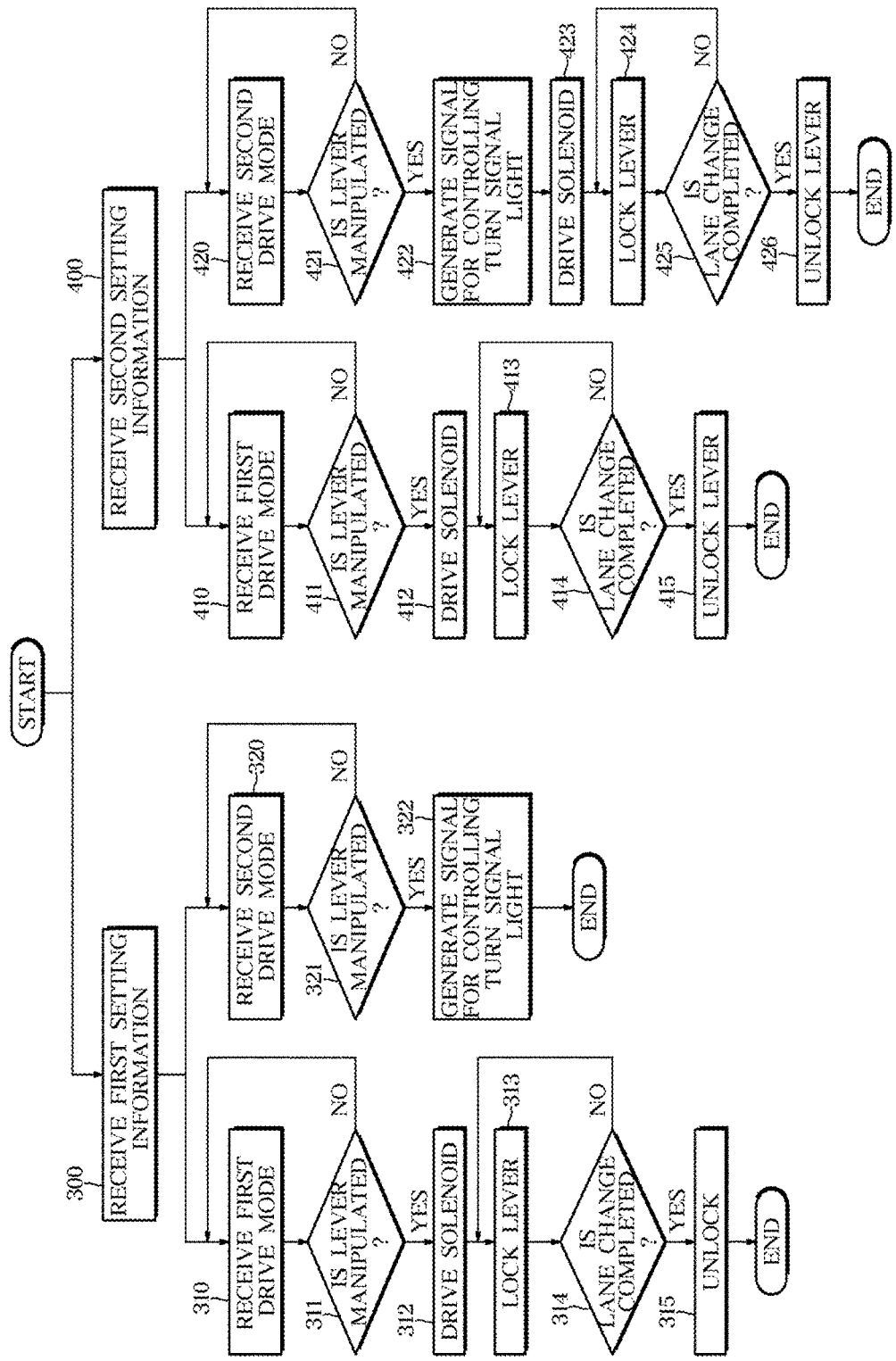
FIG. 5 is a flowchart showing the method of controlling a vehicle shown in FIG. 4 in more detail.

FIG. 5 is a flowchart showing the method of controlling a vehicle shown in FIG. 4 in more detail.

Referring to FIG. 5, the vehicle 1 performs the control method according to the setting information and the drive mode input from the user.

In detail, the vehicle 1 may receive the first setting information (self-return type) from the user (300). In addition, the vehicle 1 may receive the first drive mode (autonomous drive mode) from the user (310).

As an example, the autonomous drive mode may be a Highway Driving Assist (HDA) mode. When the user inputs the HDA mode through the inputter 110, the vehicle 1 controls the autonomous driving module 150 to perform an automation feature, such as an Advanced Smart Cruise Control (ASCC) feature and a Lane Keeping Assist System (LKAS) feature.

While travelling in the autonomous drive mode, the vehicle 1 may determine whether the lever 21 is manipulated by the user (311).

The user may move the lever 21 by a predetermined angle (e.g., 6 degrees) from the reference position 26 as described above with reference to FIG. 2. The vehicle 1 may determine that an input regarding a lane change is received based on the angle of movement of the lever 21.

When there is no manipulation of the lever 21, the vehicle 1 may continue to run the highway in the autonomous drive mode.

When a manipulation of the lever 21 is detected, the vehicle 1 drives the solenoid 24 (312).

The solenoid 24 holds the lever 21 having been moved, as described above with reference to FIG. 2. The vehicle 1 drives the solenoid 24 to lock the lever 21 (313).

With autonomous driving technology related research, research to ensure the safety of users is also conducted. According to the present disclosure, the vehicle 1 may allow the lever 21 to be held in the first drive mode (autonomous drive mode) even when the first setting information (self-return type) is input by the user, thereby alleviating the inconvenience that the user keeps gripping the lever 21 until the lane change is completed, and allowing a stable lane change.

The vehicle 1 changes from the lane currently being travelled on to a lane in a direction input by the user. The vehicle 1 determines whether the lane change is currently completed based on information of the sensor provided outside of the vehicle 1 and navigation position information (314).

When the lane change is not completed, the vehicle 1 keeps the lever 21 retrained.

When the lane change is completed, the vehicle 1 drives the solenoid 24 to unlock the lever 21 (315).

The unlocked lever 21 is moved to the reference position 26 without a user's input.

Meanwhile, the user may input the second drive mode (manual drive mode) while inputting the first setting information (self-return type) (320).

The vehicle 1 controls the vehicle wheels based on a user's manipulation on the steering wheel 10 according to the second drive mode. The vehicle 1 monitors whether the lever 21 is manipulated during a travel (321).

When the lever 21 is manipulated, the vehicle 1 turns on the turn signal light and generates a turn signal light signal that is related to the angle of manipulation of the lever 21 (322).

The moved lever 21 is moved to the reference position 26 again after a preset time without a user's additional input.

The vehicle 1 may receive the second setting information (lock type) from the user (400). In addition, the vehicle 1 may receive a selection of the first drive mode (autonomous drive mode) from the user (410).

While travelling in the autonomous drive mode, the vehicle 1 may determine whether the user manipulates the lever 21 (411).

When there is no manipulation of the lever 21, the vehicle 1 may continue to run the highway in the autonomous drive mode.

As an example, the user may move the lever 21 downward from the reference position 26 by 6 degrees. The vehicle 1 confirms that the movement of the lever 21 corresponds to an input for changing from the lane currently being travelled on to a left lane of the lane currently being travelled on.

The vehicle 1 drives the solenoid 24 with the manipulation of the lever 21 (412).

The vehicle 1 drives the solenoid 24 to lock the lever 21 (413).

The vehicle 1 changes from the lane currently travelled on to a lane corresponding to a direction input by the user. The vehicle 1 determines whether the lane change is completed based on information of the sensor provided at the outside of the vehicle 1 and navigation position information (414).

When the lane change is not completed, the vehicle 1 keeps the lever 21 held.

When the lane change is completed, the vehicle 1 drives the solenoid 24 to unlock the lever 21 (415).

Alternatively, the user may input the second drive mode (manual drive mode) together with the second setting information (lock type) (420).

The vehicle 1 keeps the lever 21 held even when an input regarding a lane change is received according to input information of the user. In addition, the vehicle 1 performs the following control method to unlock the lever 21.

In detail, the vehicle 1 may determine whether the user manipulates the lever 21 during a travel (421).

When there is no manipulation of the lever 21, the vehicle 1 continues to run according to a user's manipulation of the steering wheel 10.

When the lever 21 is manipulated, the vehicle 1 generates a signal for controlling a turn signal light (422).

At the same time, the vehicle 1 drives the solenoid 24 based on the second setting information (lock type) (423). When the solenoid 24 is driven, the lever 21 is locked at the moved position (424).

The vehicle 1 determines whether the lane change has been canceled, even when the second setting information is input (425).

In embodiments, in the manual drive mode rather than the autonomous drive mode, the vehicle 1 has a difficulty in determining whether the lane change has been completed. Accordingly, the vehicle 1 determines whether to unlock the lever 21 based on the steering angle of the steering wheel 10 and the current running speed (vehicle speed) of the vehicle 1.

The vehicle 1 may determine that the lane change has been cancelled only when a steering angle equal to or greater than a certain degree is detected at the vehicle speed. Details thereof will be described below with reference to FIG. 6.

When it is determined that the lane change has been canceled, the vehicle 1 controls the solenoid 24 and unlocks the level 21 (426).

Figure 6:
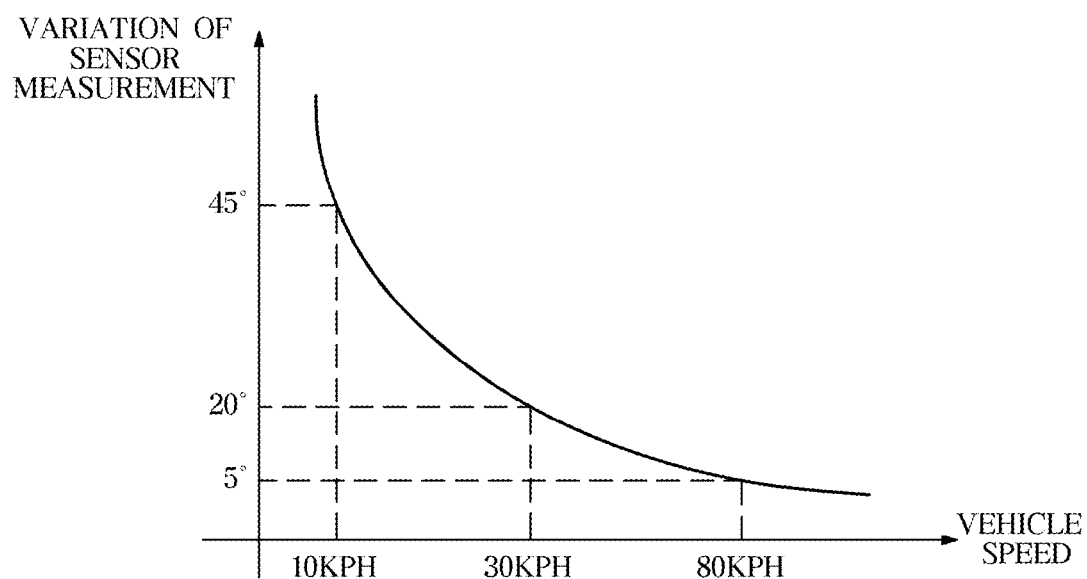
FIG. 6 is a graph showing a criterion for cancelling a lane change in response to receiving second setting information.

FIG. 6 is a graph showing a criterion for cancelling a lane change in a case of the second setting information being input.

The X-axis represents the vehicle speed of the vehicle on travelling, and the Y-axis represents the steering angle detected by the steering angle sensor. In detail, the vehicle speed may be a speed that is determined based on information of the speed sensor 120 or navigation information. The steering angle may be a steering angle of the steering wheel 10, or a value of a turning angle of the vehicle wheel relative to a turning angle of the steering wheel, which is detected by a sensor.

Referring to FIG. 6, when the steering angle is 45 degrees or more at a vehicle speed of 10 KPH, the vehicle 1 may determine that a lane change has been canceled. When the lane change is cancelled, the vehicle 1 unlocks the held lever 21.

As another example, when the steering angle is 20 degrees or more at a vehicle speed of 30 KPH. The vehicle 1 determines that a lane change has been cancelled In embodiments, the vehicle 1 performs unlocking of the lever 21 with a criterion for unlocking the lever 21 (i.e., a variation in steering angle) that is set to become smaller as the vehicle speed increases.

FIG. 7 is a table for describing an embodiment for changing an operating angle.

The vehicle 1 may variously change the operating angle of the lever 21 according to the user's tendency and preference. Here, the operating angle refers to an angle of movement of the lever 21, and a minimum angle at which the vehicle 1 may determine an input to be a lane change rather than a full turn.

Referring to FIG. 7, the vehicle 1 may change the operating angle in consideration of a user with short fingers. When the operating angle has been set to 6 degrees, the vehicle 1 may change the operating angle to 4.5 degrees according to an user's input. The input of the user is stored, and when the lever 21 is moved by 4.5 degrees in the next travel, the vehicle 1 performs a control method for a lane change.

The vehicle 1 may change the operating angle even during a travel. In detail, in a high-speed travelling, the driving safe is ensured by minimizing the hand movement of the user in moving the lever 21. Accordingly, the vehicle 1 may classify the vehicle speed into a low speed (30 KPH or less), a medium speed (31 KPH to 70 KPH), and a high speed (71 KPH or more) and vary the operating angle according to the speed of the vehicle currently on running.

In combination with the above-described input of the user, the vehicle 1 may set the operating angle, which varies according to the vehicle speed, to be further changed by a user with a small hand. For example, even when the vehicle 1 sets the operating angle to 5 degrees at a high speed (71 KPH or more), the operating angle may be changed to 3.5 degrees by an user's adjustment. Accordingly, the vehicle 1 may determine that an input of a lane change has been received even when the user moves the lever 21 by 3.5 degrees while running at 75 KPH.

The embodiment shown in FIG. 7 is an example, and the present disclosure may further include various embodiments.

According to the above, the vehicle 1 may adjust the setting of the turn signal switch which is adjustable to suit the user's taste and the state of the vehicle currently running while satisfy the related legislation for autonomous navigation. Accordingly, the vehicle 1 simultaneously satisfies the stability and the user's convenience.

As is apparent from the above, the vehicle and the method of controlling the same can satisfy the stability and the convenience of user while meeting related legislation for autonomous navigation by adjusting a setting of a turn signal switch that is adjustable to suit a taste of a user and a status of a vehicle currently on running.

Logical blocks, modules or units described in connection with embodiments disclosed herein can be implemented or performed by a computing device having at least one processor, at least one memory and at least one communication interface. The elements of a method, process, or algorithm described in connection with embodiments disclosed herein can be embodied directly in hardware, in a software module executed by at least one processor, or in a combination of the two. Computer-executable instructions for implementing a method, process, or algorithm described in connection with embodiments disclosed herein can be stored in a non-transitory computer readable storage medium.

Although embodiments of the invention have been described above, those skilled in the art may understand that configurations of the various embodiments described above may be changed without departing from the spirit of the invention. It will be also understood that the changes fall within the scope of the invention.

What is claimed is:

1. A vehicle comprising:
   a lever;
   a magnetic sensor configured to detect an angle of movement of the lever;
   an inputter configured to receive setting information regarding a lane change and a drive mode from a user; and
   a controller configured to determine whether to lock the lever based on at least one of the detected angle, the setting information, and the drive mode, and further configured to determine whether to unlock the lever based on the drive mode and the lane change,
   wherein the setting information is configured to be selected by the user and includes:
   first setting information for moving the lever to a reference position after a predetermined time, and
   second setting information for holding the lever at the detected angle of the lever.

2. The vehicle of claim 1, wherein the drive mode includes a first drive mode for changing lanes based on a nearby vehicle sensed by the vehicle and a second drive mode for changing lanes based on a steering angle of a steering wheel manipulated by the user.

3. The vehicle of claim 2, wherein with the first setting information and the first drive mode, the controller is configured to determine whether the lane change is completed, and subsequently cause the lever to be unlocked when determined that the lane change is completed.

4. The vehicle of claim 2, wherein with the first setting information and the second drive mode, the controller is configured to generate a signal regarding the lane change, and subsequently cause the lever to move to the reference position.

5. The vehicle of claim 2, wherein with the second setting information and the first drive mode, the controller is configured to determine whether the lane change is completed, and subsequently cause the lever to be unlocked when determined that the lane change is completed.

6. The vehicle of claim 2, wherein with the second setting information and the second drive mode, the controller is configured to cause the lever to be unlocked based on the steering angle of the steering wheel and a vehicle speed of the vehicle.

7. The vehicle of claim 1, further comprising a solenoid configured to hold the lever,
   wherein the controller is configured to control the solenoid to lock the lever.

8. The vehicle of claim 1, wherein the inputter is configured to receive an input regarding an operating angle, and
   wherein the controller is configured to compare the angle of movement of the lever with the operating angle.

9. The vehicle of claim 8, wherein the controller is configured to adjust the operating angle based on a speed at which the vehicle travels.

10. A method of controlling a vehicle, the method comprising:
    receiving setting information regarding a lane change and a drive mode from a user;
    detecting an angle of movement of a lever caused by the user;
    determining whether to lock the lever based on at least one of the detected angle, the setting information, and the drive mode; and
    unlocking the lever based on the drive mode and the lane change,
    wherein the setting information includes first setting information for moving the lever to a reference position after a predetermined time and second setting information for holding the lever at the detected angle of the lever, and
    wherein the first setting information or the second setting information is configured to be selected by the user.

11. The method of claim 10, further comprising performing a full turn when the angle of movement of the lever is greater than or equal to a predetermined angle.

12. The method of claim 10,
    wherein the drive mode includes a first drive mode for changing lanes based on a nearby vehicle sensed by the vehicle and a second drive mode for changing lanes based on a steering angle of a steering wheel manipulated by the user.

13. The method of claim 12, wherein the unlocking includes, with the first setting information and the first drive mode, determining whether the lane change is performed, and subsequently unlocking the lever.

14. The method of claim 12, wherein the unlocking includes, with the first setting information and the second drive mode, generating a signal regarding the lane change, and subsequently moving the lever to the reference position.

15. The method of claim 12, wherein the unlocking includes, with the second setting information and the first drive mode, determining whether the lane change is performed, and subsequently unlocking the lever.

16. The method of claim 12, wherein the unlocking includes, with the second setting information and the second drive mode, unlocking the lever based on the steering angle of the steering wheel and a vehicle speed of the vehicle.

17. The method of claim 10, wherein the receiving includes receiving an input regarding an operating angle,
    wherein the determining of whether to lock the lever includes comparing the angle of movement of the lever with the operating angle.

18. The method of claim 17, further comprising adjusting the operating angle based on a speed at which the vehicle travels.

19. The method of claim 10, wherein the receiving includes, after ignition of the vehicle is turned on, receiving the setting information regarding the lane change and the drive mode from the user.

* * * * *